United States Patent [19]

Fujimori

[11] Patent Number: 5,790,064

[45] Date of Patent: Aug. 4, 1998

[54] APPARATUS AND METHOD FOR SWITCHING CAPACITORS WITHIN A SWITCHED CAPACITOR CIRCUIT AT TIMES SELECTED TO AVOID DATA DEPENDENT LOADING UPON REFERENCE VOLTAGE SUPPLIES

[75] Inventor: Ichiro Fujimori, Kanagawa, Japan

[73] Assignees: Oasis Design, Inc.; Asahi Kasei Microsystems Co., Ltd., Japan

[21] Appl. No.: 630,390

[22] Filed: Apr. 10, 1996

[51] Int. Cl.⁶ .................................................. H03M 1/12
[52] U.S. Cl. ............................................ 341/172; 341/155
[58] Field of Search ........................... 341/172, 110, 341/122, 123, 143, 150; 375/28

[56] References Cited

U.S. PATENT DOCUMENTS

| | | |
|---|---|---|
| 4,698,596 | 10/1987 | Haigh et al. . |
| 4,837,527 | 6/1989 | Sauer . |
| 4,851,841 | 7/1989 | Sooch . |
| 5,039,963 | 8/1991 | Fischer . |
| 5,293,169 | 3/1994 | Baumgartner et al. . |
| 5,412,387 | 5/1995 | Vincellette et al. . |

FOREIGN PATENT DOCUMENTS

| | | |
|---|---|---|
| 64-49311 | 2/1989 | Japan . |
| 64-49311 | 3/1989 | Japan . |
| 1-49311 | 10/1989 | Japan . |
| 2-199918 | 8/1990 | Japan . |

OTHER PUBLICATIONS

Ribner, et al., "A Third-Order Multi Stage Sigma-Delta Modulator With Reduced Sensitivity to Nonidealities", IEEE Journal of Solid-State Circuits, vol. 26, No. 12 (Dec. 1991), pp. 1764-1774.

Harris, Steven, "How to Achieve Optimum Performance from Delta Sigma A/D and D/A Converters", J. Audio Eng. Soc. vol. 41, No. (Oct. 1993), pp. 782-790.

Primary Examiner—Brian K. Young
Attorney, Agent, or Firm—Kevin L. Daffer; Conley, Rose & Tayon

[57] ABSTRACT

A D/A switched capacitor circuit, employed as part of a delta-sigma modulator, is provided. The modulator forms part of an A/D converter system, and the switched capacitor circuit is controlled by careful selection of clock phases. The clock phases, or more specifically four clock phases, are provided to ground both plates of switched capacitors within the D/A circuit subsequent to their discharge upon the integrator and prior to the next sampling period. Full discharge of shared capacitors to a ground voltage substantially eliminates any data dependent loading of integrator offset voltages upon the reference voltage supplies. Substantial reduction or elimination of data-dependent values prevents ac modulation of the referenced voltage supply and the imputed noise associated therewith.

26 Claims, 4 Drawing Sheets

APPARATUS AND METHOD FOR SWITCHING CAPACITORS WITHIN A SWITCHED CAPACITOR CIRCUIT AT TIMES SELECTED TO AVOID DATA DEPENDENT LOADING UPON REFERENCE VOLTAGE SUPPLIES

BACKGROUND OF THE INVENTION

1. Field of the Invention

This invention relates to a mixed signal system and, more particularly, to a switched capacitor circuit employed as part of an analog-to-digital (A/D) converter. Voltages of an analog input ($V_{in}+$ and $V_{in}-$), as well as reference voltages ($V_{ref}+$ and $V_{ref}-$) output from a quantizer, are sampled upon capacitors within the switched capacitor circuit. After discharging the sampled charge to an integrator, the capacitors are fully discharged to ground prior to the next sampling cycle. Discharging the capacitors prior to resampling prevents data dependent loading upon the reference voltage supplies.

2. Description of the Relevant Art

Integrated circuits which embody both analog and digital circuitry on the same monolithic substrate are well known. Examples of such integrated circuits include circuits which convert digital to analog signals and analog to digital signals. A circuit for converting analog to digital signals is herein referred to as an A/D converter. A popular A/D converter employs a delta-sigma modulator, often referred to as an "oversampled" modulator. As a mixed signal circuit, a delta-sigma modulator contains analog circuitry, and digital circuitry in a feedback loop. The delta-sigma modulator oversamples an incoming analog signal at a rate much greater than the Nyquist sample rate, and converts the analog signal to a one-bit digital bit stream.

A delta-sigma modulator employed within an A/D converter serves to manipulate the noise spectrum of the analog input signal so that most of the noise power, commonly referred to as quantization noise, is moved to frequencies substantially outside the signal bandwidth. This is referred to as noise shaping. A filter can then readily be used to reduce the out-of-band shaped quantization noise to acceptable levels.

A delta-sigma modulator found within an A/D circuit typically includes a network of switched capacitors. The switched capacitors serve to periodically sample the input signal as well as a reference voltage source selected by the quantized feedback data. Sampling includes periodically charging one or more of the switched capacitors from the input voltage and/or reference voltage. Periodic sampling is often termed "charge loading".

After being charge loaded, the switched capacitors are thereafter discharged (or "dumped") onto a summing node. According to a typical switched capacitor configuration, a sampled analog input signal is combined with a sampled reference voltage during the time in which the switched capacitors are discharged onto the summing node. The combined, or summed, samples are then forwarded from the summing node onto an integrator. When included within a modulator loop, the integrator has a high pass effect on the noise component (i.e., quantization noise). For this reason, the switched capacitors, in conjunction with the integrator, serves as a noise shaping filter.

A modulator within an A/D converter includes at least three sub-components: a network of switched capacitors, an integrator, and a quantizer. The switched capacitors function to combine the analog input signal with the output of a D/A converter, the input of which is controlled by the quantizer. Based on the voltage value output from the quantizer, either a positive or negative reference voltage ($V_{ref}+$ or $V_{ref}-$) is sampled and summed with the analog input voltage ($V_{in}$) at the input of the integrator. Thus, times in which either $V_{ref}+$ or $V_{ref}-$ are forwarded into the integrator are controlled by the current value of a digital bit stream. For example, a logic low value (i.e., $Y=1$ value) within the quantizer bit stream output causes closure of a $Y=1$ (i.e., Y) switch. Closure of Y switch corresponds to the D/A converter selecting, for example, $+V_{ref}$. Conversely, a $Y=-1$ logic value will cause closure of the $Y=1$ (i.e., Y bar) switch.

A clearer understanding of switched capacitors and, more particularly, the D/A portion of a network of switched capacitors is provided in reference to FIG. 1. FIG. 1 illustrates an exemplary arrangement of switched capacitors within a conventional D/A circuit 10. Circuit 10 is responsible for attributing $V_{ref}+$ and $V_{ref}-$ to the appropriate differential input of integrator 12. Another set of switch capacitors (shown in FIG. 3) are responsible for attributing the proper analog input voltage $V_{in}+$ and $V_{in}-$ to integrator 12a input, for summation with the sampled $V_{ref}+$ and $V_{ref}-$ signals.

Operation of switched capacitor circuit 10 may be controlled by a conventional two-phase clock $\phi 1$ and $\phi 2$. FIG. 2 illustrates a conventional two-phase clock $\phi 1$ and $\phi 2$ timing diagram useful for switched capacitor applications in general. During logic high values of clock $\phi 1$, a sampling of $V_{ref}+$ and $V_{ref}-$ occurs. Sampling times are shown in FIG. 2 as reference numerals 14 and 16. Between sampling periods there exist a dischage period in which the sampled charge upon Cr switched capacitor is dumped onto integrator 12. The discharge period is often referred to as an integrate period.

During $\phi 2$ and during a $Y=1$ (Y) digital data value, reference voltages $V_{ref}+$ and $V_{ref}-$ are discharged from the switched capacitor Cr to inverting inputs of differential integrator 12. During Y, the output voltage $V_{out}+$ at the nth discharge cycle equals $V_{ref}+\times Cr/Ci+V_{out}+(n^{th-1})$ The opposite polarity output voltage $V_{out}-$ during the nth discharge cycle equals $V_{ref}-\times Cr/Ci+V_{out}-(n^{th-1})$. As shown from these equations, the output voltage from integrator 12 is dependent not only on the output voltage during the previous integrate cycle, but also upon the reference voltages output from the D/A portion of a switched capacitor circuit. The output voltage during the nth discharge attributable solely to the D/A output therefore equals $2V_{ref}\times Cr/Ci+V_{out}(n^{th-1})$, where $V_{out}=V_{out}+-V_{out}-$, and where $V_{ref}=V_{ref}+=-V_{ref}-$. When $Y=-1$ (Y bar) is selected, then the output voltage during the nth discharge attributable solely to the D/A output therefore equals $-2V_{ref}\times Cr/Ci+V_{out}(n^{th-1})$.

FIG. 3 illustrates a network of switched capacitors 20 within a switched capacitor integrator. Switched capacitors 20 are capacitors found within $V_{in}$ and $V_{ref}$ paths. As part of switched capacitor network 20, a D/A switched capacitor network 10a is presented. Switched capacitors within circuit 10a are controlled to formulate sample and integrate from reference voltage supplies using a four-phase clock. An exemplary four-phase clock used in controlling circuit 10a is shown in reference to FIG. 4.

FIG. 4 depicts a timing diagram of four-phase clocks $\phi 1$, $\phi 1D$, $\phi 2$ and $\phi 2D$. The four-phase clocks shown in FIG. 4 prove beneficial in reducing DC offset generated by switches placed in an "off" position. More particularly, proper timing of the four-phase switching has been shown to reduce the offset of parasitic capacitance on the source and control terminals of FET switches within circuit 10a, and the DC offset problem resulting therefrom. See, e.g., U.S. Pat. No. 4,698,596 (herein incorporated by reference).

By incorporating a delay 24 of clock $\phi$1D trailing edge from clock $\phi$1, switches controlled by clock $\phi$1D always turn "off" after clock $\phi$1. Any charge injection as a result of parasitic capacitance controlled by clock $\phi$1D will not be absorbed by switched capacitors Crp or Crn. The charge injection in switches controlled by $\phi$1 are equal, so any charge injection will be canceled by fully-differential signal processing. Without delay 24, the charge injection difference of switches controlled by clock $\phi$1D will cause DC offset.

While DC offset is substantially eliminated using delay 24, data dependent loading still exists on the reference voltage supplies $V_{ref}+$ and $V_{ref}-$. Using the exemplary circuit 10a, and the four-phase clock shown in FIG. 4, charge exists across capacitor Crp during high voltage values of phase clocks $\phi$2 and $\phi$2D as follows:

When Y=1 (Y), then Qrp=(0−+$V_{of}$)×Crp=−$V_{of}$×Crp.

When Y=−1 (Y bar), then Qrp=(0−−$V_{of}$)×Crp=+$V_{of}$×Crp. Offset voltages, +$V_{of}$ and −$V_{of}$ are voltages present at the input of differential integrator 12a, shown in FIG. 3. It is known that amplifiers, such as the amplifier within integrator 12a, do not have perfectly balanced input stages, owing primarily to manufacturing variations. If the two inputs of integrator 12a are connected together for a zero input signal, the output will usually saturate to either the positive or negative power supply. The difference in input voltages necessary to bring about the $V_{out}$ to zero is called the input offset voltage, and is designated in FIG. 3 as +$V_{of}$ and −$V_{of}$. Input offset voltages often drift with temperature and time, even if the original offset is trimmed to zero. Not only do input offset voltages deleteriously effect charge across switch capacitors Crp but, more importantly, the resulting voltage across those capacitors is dependent upon the digital bit value state Y=1 or Y=−1. Data dependency is herein referred to as the dependency of charge across the switched capacitors as a function of the digital value within the bit stream which controls circuit 10a. The data dependency across the switched capacitors resulting from switches $\phi$2 and $\phi$2D being on, thereafter translates to the reference voltage supplies during the subsequent sampling period (i.e., during the time in which switches $\phi$1D and $\phi$1 are on).

A four-phase clock, even with delay 24 to prevent D/C offset, still incurs data dependency on the reference voltage supplies. The data dependency, or dependency on the value of the digital data (Y=1 or Y=−1) causes significant problems on the reference voltage supply. Those problems primarily exist as $V_{ref}$ modulation. Modulation of $V_{ref}$ by an ac component near the higher end in which the quantatization noise exists (i.e., $f_s/2$) will cause a delta-sigma modulator to modulate the quantatization noise back to passband (i.e., near dc). For example, if $V_{in}$ is exactly at the middle of the peak-to-peak range, then the duty cycle of digital value Y is 50%, which means that the ac component upon $V_{ref}$ will be near $f_s/2$. It is therefore important to minimize data dependent loading on $V_{ref}$ so as to help eliminate the problems of imputed inband noise upon the modulator. The problems of having ac components on the $V_{ref}$ voltage supplies is fairly well documented and generally described in an article to S. Harris, "How to Achieve Optimum Performance from Delta-Sigma A/D and D/A Converters", *J. Audio Eng. Soc.*, Vol. 41, No. 10 (October 1993), pp. 782-790 (herein incorporated by reference).

Attempts to remove data dependent loading from the reference voltage supplies have for the most part been unsuccessful. FIG. 5 illustrates another sequence of four-phase clocks which employs two overlaps. Overlap 26 is represented as an overlap between $\phi$1D and $\phi$2, whereas overlap 28 is represented as an overlap between $\phi$1 and $\phi$2D. The four-phase clocking scheme of FIG. 5, and the necessity for both overlaps 26 and 28 are taught in Japanese Patent No. 64-49311 (herein incorporated by reference). Overlap 26, while solving many problems still retains the aforesaid data dependency problem. When Y=−1 (Y bar), the charge across switched capacitor Crp at overlap 26 is equal to ($V_{ref}+$ + $V_{of}$)×Crp. Conversely, when Y=1 (Y), the charge across switched capacitor Crp at overlap 26 equals ($V_{ref}+$ − $V_{of}$) ×Crp. The data dependent charge, and the effect of offset voltages upon the reference voltage, occurs during overlap 26.

Depending upon the present value of the digital bit stream, and the rate of the high and low values within the bit stream, the reference voltage supply will be modulated as a result of overlap 26. AC modulation of the reference voltage supply produces problems which must be avoided if inband noise is to meet designer specifications. It would be desirable to produce a clocking scheme which has the advantages of a four-phase clock. However, the four-phase clock being produced must not cause data dependent loading upon the reference voltage supplies (either $V_{in}+$ or $V_{in}-$)

SUMMARY OF THE INVENTION

The problems outlined above are in large part solved by an improved switched capacitor circuit. The switched capacitor circuit forms the front-end of a delta-sigma modulator. More specifically, the switched capacitor circuit can be used as a D/A converter. The D/A converter output is sampled and summed with a sampled analog signal at the input of an integrator. The integrator output is fed into a quantizer, the output of which is represented as a digital bit stream for controlling switches within the switched capacitor circuit. The modulator hereof is used to convert analog input signals, and is classified as an oversampling modulator, or a delta-sigma modulator. Data dependency problems are avoided by employing an improved switched capacitor arrangement and, more particularly, an improved sequence of four-phase clocks.

Data dependency is substantially eliminated by employing an overlap of phase $\phi$1 and phase $\phi$2D in the interim between an integrate period and a subsequent sampling (or re-sampling) period. Accordingly, the present invention is partially directed to the arrangement of control clocking signals used for opening and closing switches within a switched capacitor circuit and, more specifically, a D/A converter circuit. By overlapping clock phase $\phi$1 with clock phase $\phi$2D during the interim period, complete grounding of the switched capacitor occurs prior to the time in which the next sampling of $V_{ref}$ occurs. Thus, $V_{ref}$ supply "sees" a ground voltage amount on the switched capacitor regardless of the current digital data value Y or the previous digital data value.

Broadly speaking, the present invention contemplates an A/D system. The A/D system includes a switched capacitor integrator having an input upon which a reference voltage is operably connected. A capacitor is configured within the switched capacitor integrator. The capacitor includes a spaced pair of conductive plates. The capacitor is operably configured to receive the reference voltage during each one of a first sampling period and a second sampling period of a clocking signal. The capacitor is also configured to discharge the reference voltage from the capacitor during an integrate period of the clocking signal. The capacitor is yet further configured to receive a direct grounding path on both plates after the integrate period but before the second sampling. The A/D system further includes a quantizer coupled to receive an output from the switched capacitor integrator.

The present invention further contemplates a switched capacitor integrator. The integrator comprises a capacitor having a opposed first and second plates. A first switch is coupled between a reference voltage and the first plate, a second switch is coupled between a ground voltage and the first plate, a third switch is coupled between the integrator and the second plate, and a fourth switch is coupled between a second plate and a ground voltage plate. A clocking signal having a first phase, second phase, third phase and fourth phase is presented to the first, second, third and fourth switches. More specifically, the first phase is operably coupled to close the fourth switch. The second phase is operably coupled to close the first switch, the third phase is operably coupled to close the third switch, and the fourth phase is operably coupled to close the second switch. The first phase is timed such that it overlaps with a fourth phase for a time period prior to the second and third phase. As defined herein, first, second, third and fourth phases are voltage values which close corresponding switches. For example, if the switches are transistors, then a high voltage value or "phase" causes closure of a corresponding switch.

BRIEF DESCRIPTION OF THE DRAWINGS

Other objects and advantages of the invention will become apparent upon reading the following detailed description and upon reference to the accompanying drawings in which.

Figure 1:
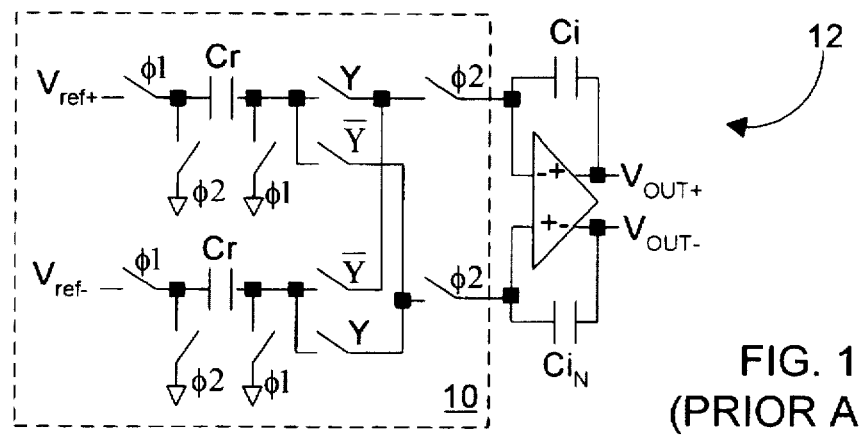
FIG. 1 is a schematic diagram of a switched capacitor integrator according to a conventional design.
Figure 2:
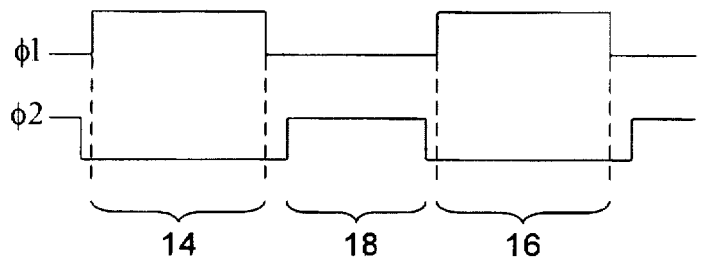
FIG. 2 is a timing diagram of a conventional two phase clock $\phi 1$ and $\phi 2$ used in controlling the switched capacitor integrator of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 6:
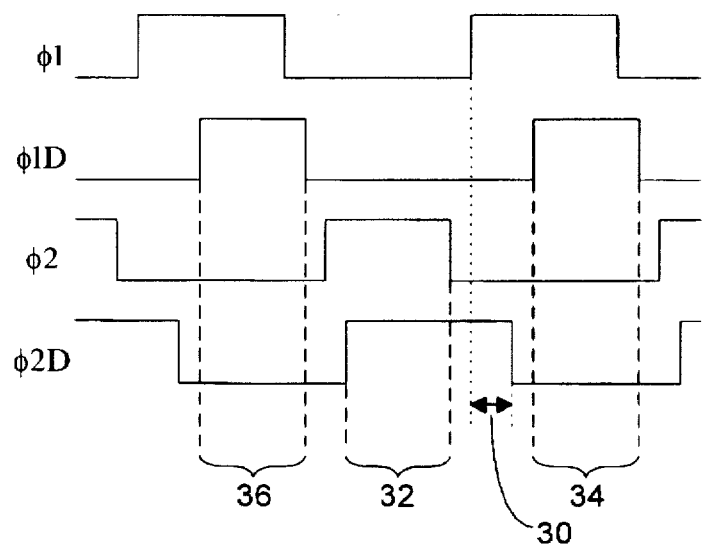
FIG. 6 is a timing diagram of a four phase clock $\phi 1$, $\phi 1D$, $\phi 2$ and $\phi 2D$ according to the present invention for controlling the switched capacitor integrator of FIG. 3.
Figure 8:
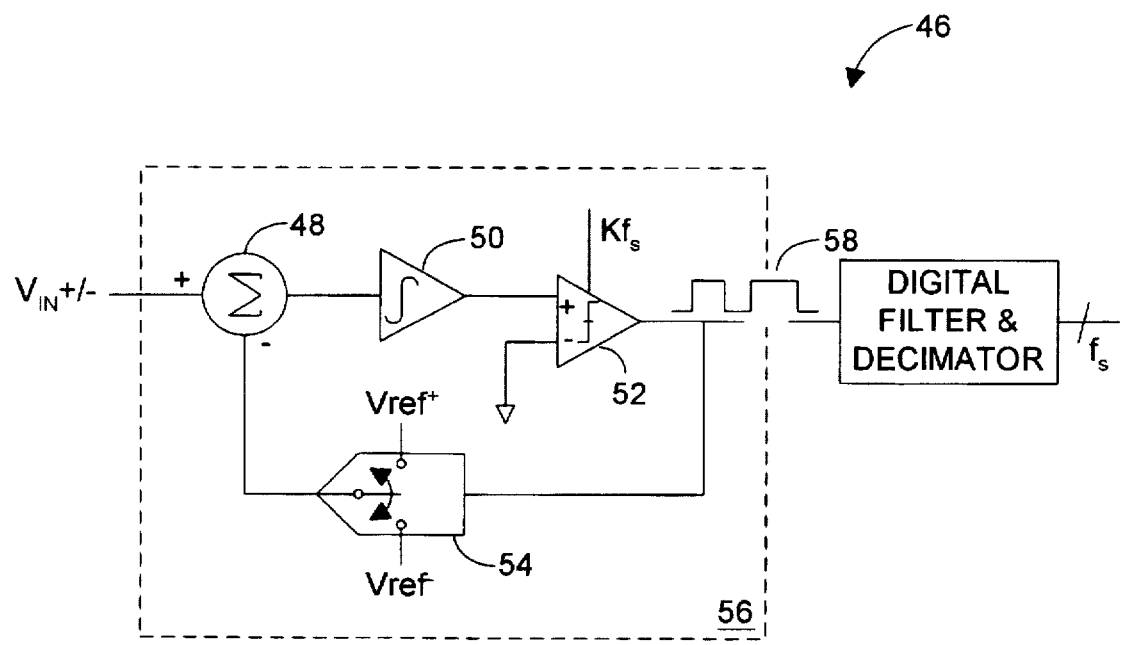
FIG. 8 is a block diagram of an A/D converter employing a switched capacitor integrator clocked in accordance with the four phase clock accorded to the present invention.
Figure 7:
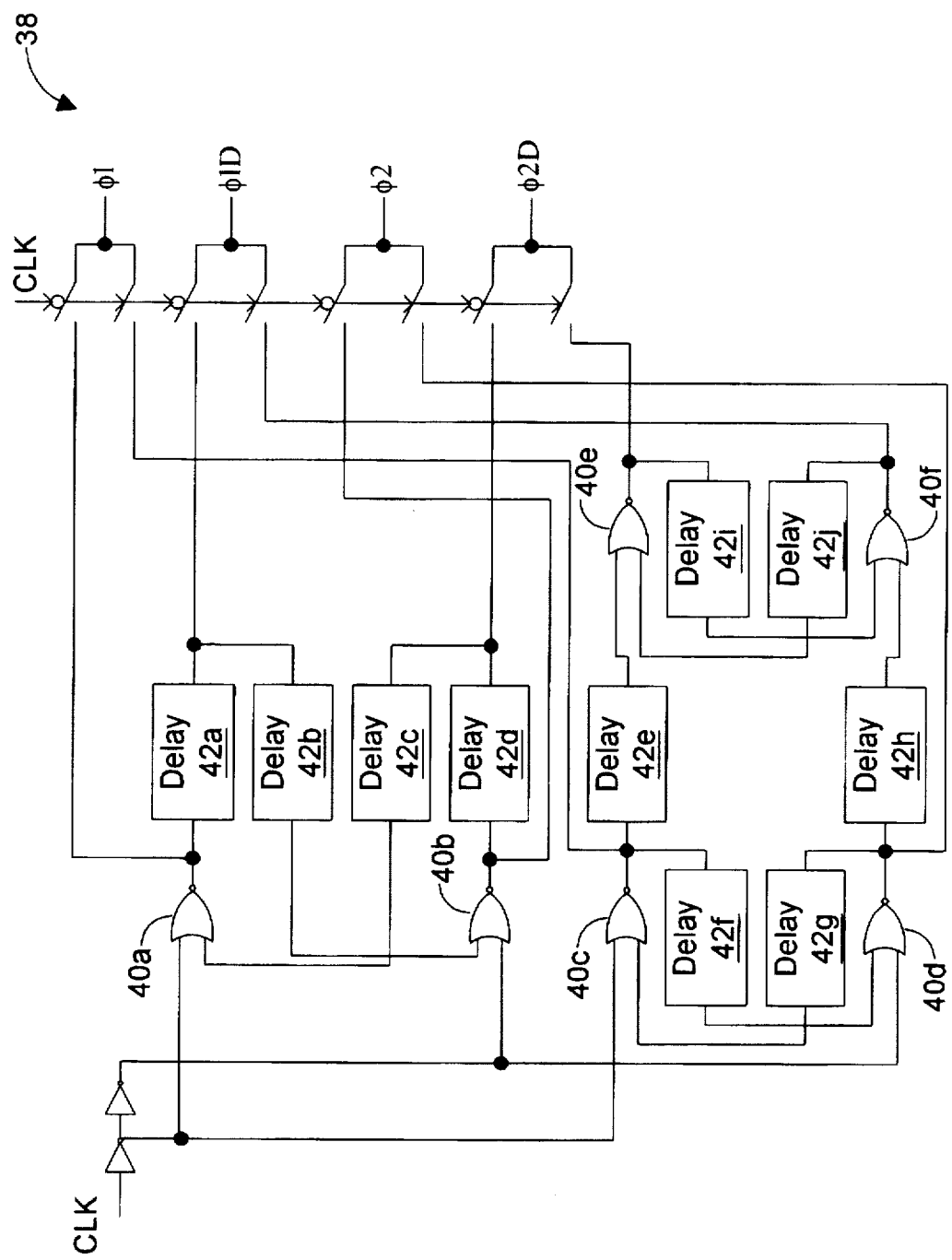
FIG. 7 is a schematic diagram illustrative of one exemplary form by which the present four phase clock is derived.

Turning now to FIGS. 6–8, a timing diagram, a circuit necessary to effectuate timing diagram, and an A/D system employing the timing diagram are shown, respectively. FIG. 6 illustrates an improved clocking scheme whereby an overlap 30 is presented between an integrate period 32 and a sampling (or re-sampling) period 34. The integrate period 32, often referred to as a discharge period, occurs during times in which sampled reference voltages upon the switched capacitor are discharged to the input of an integrator. Integrate, or discharge, implies a pre-existing charge upon the switched capacitor, resulting from an earlier sampling period 36. Integrate period 32 therefore occurs between sampling periods 36 and 34, all of which occur at high speeds necessary for an oversampling-type modulator.

Figure 3:
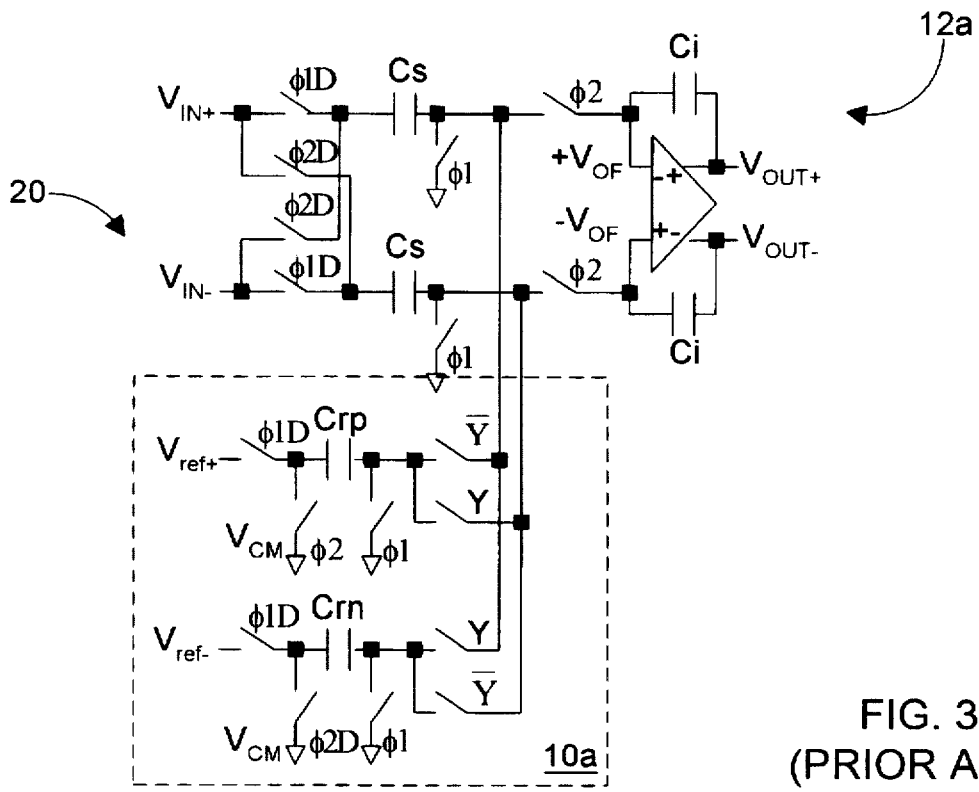
FIG. 3 is a schematic diagram of an exemplary switched capacitor integrator employing a fully differential integrator and opposite polarity reference and analog input voltages according to a conventional design.
Figure 4:
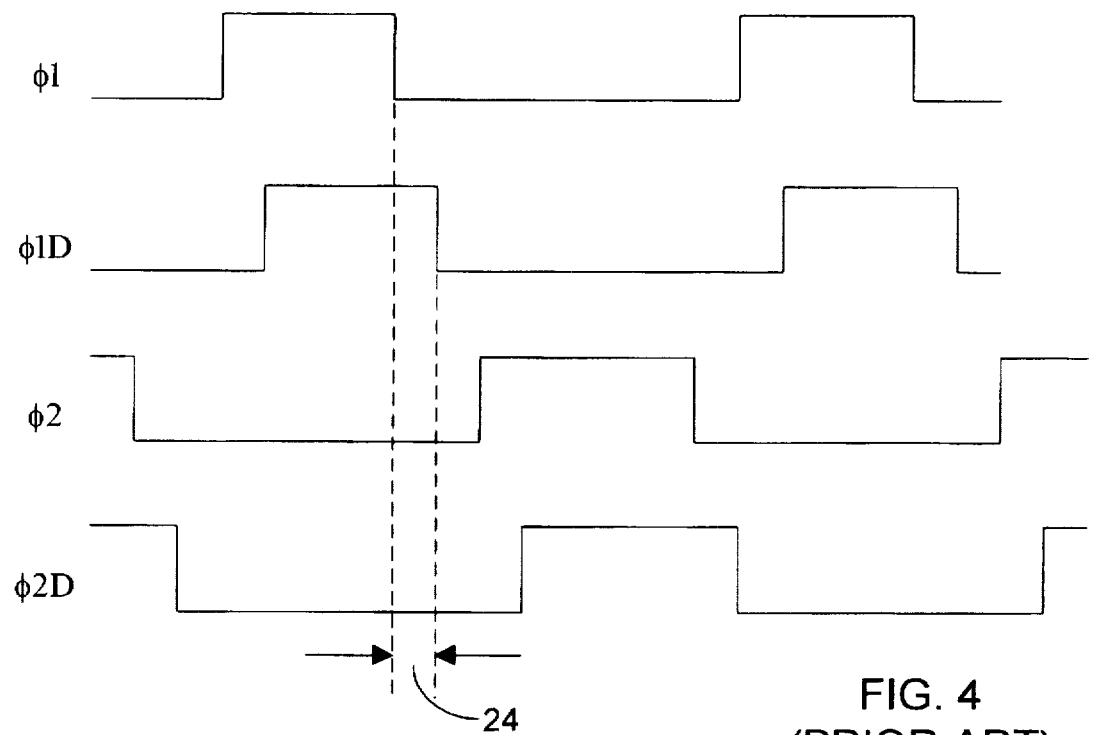
FIG. 4 is a timing diagram of a conventional four phase clock $\phi 1$, $\phi 1D$, $\phi 2$ and $\phi 2D$ used in controlling the switched capacitor integrator of FIG. 3.
Figure 5:
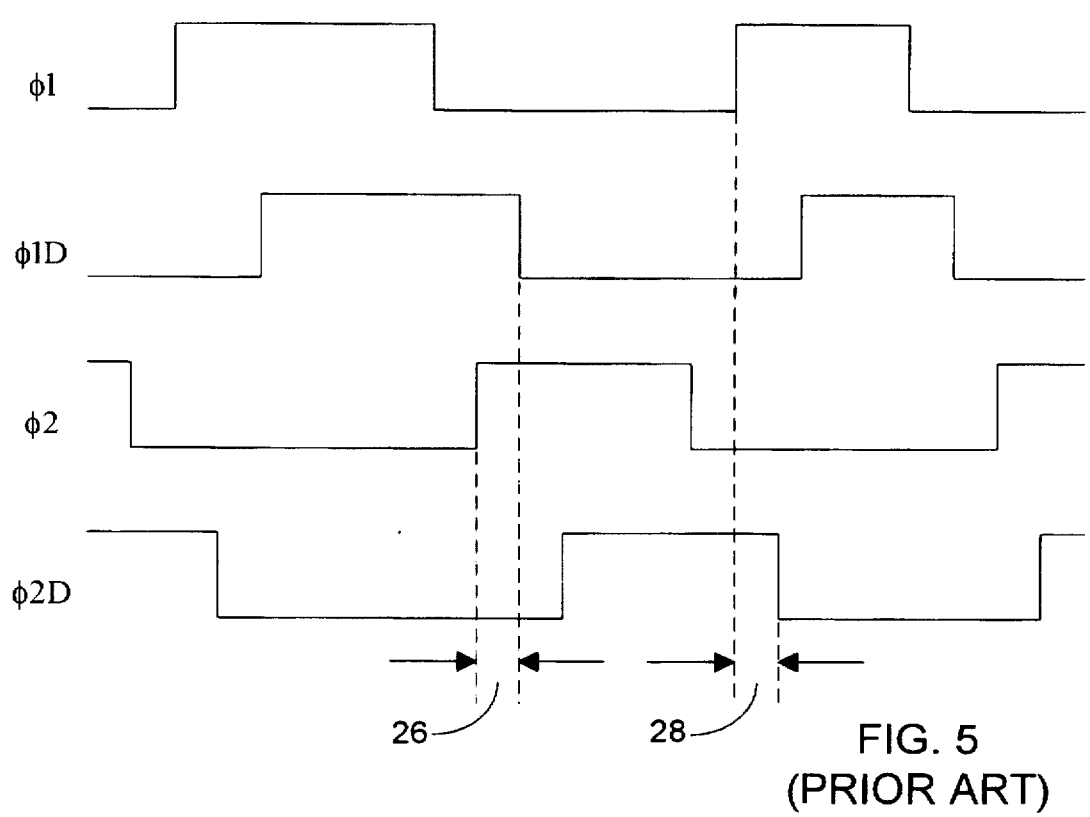
FIG. 5 is a timing diagram of another conventional four phase clock $\phi 1$, $\phi 1D$, $\phi 2$ and $\phi 2D$ used in controlling the switched capacitor integrator of FIG. 3.

Referring now to FIGS. 3 and 6 in combination, overlap 30 causes switch designated as $\phi 1$ as well as switch designated as $\phi 2D$ to close after the charge on Crp is discharged on integrator 12a but before the switch designated as $\phi 1D$ closes. Closure of switches $\phi 1$ and $\phi 2D$ ensures that any residual charge, primarily input offset voltages $V_{os}$, upon Crp are fully discharged. Removal of any residual voltages from both shared capacitors Crp and Crn prior to coupling of the reference voltage supplies thereto, prevent any data dependent loading on those supplies. Overlap 30 ensures that both plates of both switched capacitors Crp and Crn are discharged fully to ground prior to the next sampling cycle 34. Thus, switch 11 is maintained on while switch $\phi 2D$ is turned off at the culmination of overlap 30. The required length of overlap 30 is determined by the RC time constant of Crp/Crn and the resistance of the associated switches. Portions of clock $\phi 2D$ and $\phi 1$ are defined as portions of logic high voltage periods of those clocks.

FIG. 7 illustrates, according to one exemplary embodiment, various logic gates 40a, 40b, 40c and 40d which receive inverted and non-inverted states of a clocking signal CLK. One input of each logic gate 40a through 40d is coupled to receive the inverted or non-inverted CLK signal, whereas the other input receives a delayed output from a logic gate dissimilar from the recipient logic gate. The delay amounts of delay blocks 42a through 42i are chosen such that the rising edge of $\phi 1D$ is delayed from $\phi 1$, $\phi 2$ delayed from $\phi 1D$, and $\phi 2D$ delayed from $\phi 2$. Additional logic gates 40e and 40f, as well as delay blocks 42i and 42j, are used to provide additional delay and dissimilar duty cycles, as needed. CLK signal is then used to forward logic-coupled and delayed signals at select CLK transitions in accordance with switches 44a through 44d. The exemplary phase clock generation circuit 38 of FIG. 7 can be configured in numerous ways, any of which would lead to modifications in the illustrated diagram, and all of which may serve to produce the timing diagram of FIG. 6. It is therefore recognized that the exemplary diagram 38 is not to be limited to the form shown in FIG. 7 since various modifications to that form fall within the spirit and scope of the present invention.

FIG. 8 illustrates an A/D converter 46. A/D converter 46 includes a summing node 48, and integrator 50, a quantizer 52 and a D/A converter 54. Components 48 through 54 represent a delta-sigma modulator 56. Modulator 56 employs a feedback loop, wherein a digital data stream 58 of values control D/A converter 54. Digital data stream 58 is clocked at a high frequency $Kf_s$ output from quantizer 52. Digital data stream 58 is represented as a series of digital values comprising $Y=-1$ (Y bar), $Y=1$ (Y), and possibly Y=0. The Y values determine whether a $V_{ref}+$ or a $V_{ref}-$ voltage is supplied to summing node 48.

D/A converter 54 can be represented as a switched capacitor circuit such as that shown by reference numeral 10a in FIG. 3. Control of D/A circuit 54 by the Y values as well as the four phase clock shown in FIG. 6 imparts novelty in that data dependent loading upon the reference voltage supplies is substantially eliminated.

It would be appreciated by those skilled in the art having the benefit of this disclosure that this invention is believed to be capable of applications with any D/A circuit, or any modulator used within an A/D circuit. Furthermore, it is also to be understood that the invention shown and described is to be taken as presently preferred embodiments. Various modifications and changes may be made to the modulator components or the switched capacitor integrator so as to eliminate offset voltages stored upon the switched capacitors prior to the next sampling. It is intended that the following claims be interpreted to embrace all such modifications and changes and, accordingly, the specification and drawings are to be regarded in an illustrative rather than a restrictive sense.

What is claimed is:

1. An A/D system, comprising:
   a switched capacitor integrator having an input upon which a reference voltage is operably connected; and
   a capacitor having spaced conductive plates configured within said switched capacitor integrator, wherein said capacitor is operably configured (i) to receive said reference voltage during each one of a first sampling period and a second sampling period of a clocking signal, (ii) to discharge said reference voltage from said capacitor during an integrate period of said clocking signal, and (iii) to receive a direct grounding path on both plates of said capacitor after said integrate period but before the second sampling period.

2. The A/D system as recited in claim 1, wherein said switched capacitor integrator comprises a plurality of transistors having a gate terminal configured to receive said clocking signal.

3. The A/D system as recited in claim 1, wherein said clocking signal comprises a four phase clocking signal.

4. The A/D system as recited in claim 3, wherein a combination of phases within the four phase clocking signal defines the sampling period, the integrate period, and the time in which both plates of said capacitor receive the direct grounding path.

5. The A/D system as recited in claim 3, wherein one of said conductive plates is coupled to said reference voltage and the other of said plates is coupled to said grounding path during said first and second sampling periods, and wherein said four phase clocking signal is configured to terminate coupling to said grounding path prior to termination of coupling to said reference voltage.

6. The A/D system as recited in claim 1, further comprising a quantizer digital output signal coupled to select, based upon a value of said digital output signal, a value of said reference voltage for discharge during said integrate period.

7. The A/D system as recited in claim 6, wherein said capacitor discharged during the integrate period forms a conversion of the digital output signal to an analog signal.

8. The A/D system as recited in claim 1, further comprising a quantizer coupled to receive an output from the switched capacitor integrator, and said quantizer is operably configured to produce a one bit digital data stream.

9. The A/D system as recited in claim 8, wherein said one bit digital data stream comprises a sequence of digital values, and wherein each said digital value corresponds to one of at least two analog values.

10. The A/D system as recited in claim 1, wherein said sampling period occurs at more than twice the Nyquist sampling rate.

11. The A/D system as recited in claim 1, wherein said switched capacitor integrator comprises a differential amplifier having two differential inputs.

12. A switched capacitor circuit, comprising:
   a capacitor having opposed first and second plates;
   a first switch coupled between a reference voltage and said first plate, a second switch coupled between a first ground voltage and said first plate, a third switch coupled between a first output terminal and said second plate, and a fourth switch coupled between said second plate and a second ground voltage;
   a clocking signal having first phase, second phase, third phase and fourth phase signals;
   said first phase is operably coupled to close the fourth switch, said second phase is operably coupled to close the first switch, said third phase is operably coupled to close the third switch, and said fourth phase is operably coupled to close the second switch; and
   said first phase is timed such that it overlaps with said fourth phase during a time before said second phase and after said third phase.

13. The switched capacitor circuit as recited in claim 12, wherein said first phase terminates prior to said second phase.

14. The switched capacitor circuit as recited in claim 12, wherein said first and second ground voltages are equal.

15. The switched capacitor circuit as recited in claim 12, wherein said first output terminal is controlled by a digital output signal such that the switched capacitor implements a D/A function.

16. The switched capacitor circuit as recited in claim 12, further comprising a fifth switch controlled coupled between said second plate and said first terminal, wherein said fifth switch is controlled by a sequence of digital data.

17. The switched capacitor circuit as recited in claim 12, wherein said integrator comprises a differential amplifier having two differential inputs.

18. The switched capacitor circuit as recited in claim 12, wherein said first phase overlaps with said fourth phase during an early portion of said first phase and a latter portion of said fourth phase.

19. The switched capacitor circuit as recited in claim 12, wherein the overlap of said first and fourth phases causes connection of both the first and second plates to said ground voltage.

20. The switched capacitor circuit as recited in claim 12, wherein said first and second ground voltages comprise a common mode voltage.

21. The switched capacitor circuit as recited in claim 12, wherein said reference voltage comprises a first reference voltage of positive polarity or a second reference of negative polarity, and wherein the first and second reference voltages are of equal magnitude.

22. A method for reducing data dependent loading upon a reference voltage forwarded to a switched capacitor circuit, comprising:
   forwarding said reference voltage to a capacitor during a sampling period;
   discharging the reference voltage upon said capacitor to an integrator during an integrate period subsequent to said sampling period;

grounding both plates of said capacitor during a data dependent discharge period subsequent to the integrate period; and forwarding said reference voltage to a capacitor during a resampling period subsequent to the data dependent discharge period.

23. The method as recited in claim 22, wherein both said forwarding comprises connecting one plate of said capacitor to ground and thereafter connected the other plate of said capacitor to said reference voltage.

24. The method as recited in claim 22, further comprising disconnecting one plate of said capacitor from a ground voltage prior to disconnecting the other plate of said capacitor from said ground voltage.

25. The method as recited in claim 22, wherein said discharging comprises connecting one plate of said capacitor to the integrator and thereafter connecting the other plate of said capacitor to ground.

26. The method as recited in claim 22, wherein said grounding comprises maintaining connection of one plate of said capacitor to ground while connecting the other plate of said capacitor to ground.

* * * * *